(12) United States Patent
Hashitani

(10) Patent No.: US 8,847,308 B2
(45) Date of Patent: Sep. 30, 2014

(54) SEMICONDUCTOR DEVICE HAVING A TRENCH STRUCTURE

(71) Applicant: Seiko Instruments Inc., Chiba (JP)

(72) Inventor: Masayuki Hashitani, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 13/719,323

(22) Filed: Dec. 19, 2012

(65) Prior Publication Data

US 2013/0168763 A1    Jul. 4, 2013

(30) Foreign Application Priority Data

Dec. 22, 2011    (JP) .................. 2011-281632

(51) Int. Cl.
*H01L 29/78*    (2006.01)
*H01L 29/66*    (2006.01)

(52) U.S. Cl.
CPC ...... *H01L 29/7827* (2013.01); *H01L 29/66666* (2013.01)
USPC ............................................. 257/330

(58) Field of Classification Search
None
See application file for complete search history.

(56) References Cited

U.S. PATENT DOCUMENTS

2007/0007571 A1*  1/2007  Lindsay et al. ............... 257/306
2009/0026537 A1*  1/2009  Hashitani ...................... 257/330

FOREIGN PATENT DOCUMENTS

JP          08255901        1/1996
JP          2003 101027     4/2003

* cited by examiner

*Primary Examiner* — Fernando L Toledo
*Assistant Examiner* — Valerie N Newton
(74) *Attorney, Agent, or Firm* — Adams & Wilks

(57) ABSTRACT

An oxide film is formed by STI in a silicon surface region in which a substrate potential heavily doped diffusion layer and a source heavily doped diffusion layer are to be provided later between trenches at predetermined intervals. The oxide film is removed after the trench is formed, to thereby form a region which is lower than a surrounding surface. Thus, in the vertical MOS transistor having a trench structure which includes a side spacer, a silicide on a gate electrode embedded in the trench and a silicide on the substrate potential heavily doped diffusion layer and the source heavily doped diffusion layer can be separated from each other.

1 Claim, 4 Drawing Sheets

SEMICONDUCTOR DEVICE HAVING A TRENCH STRUCTURE

BACKGROUND OF THE INVENTION

1. Field of the Invention

The present invention relates to a semiconductor device, in particular, to a vertical MOS transistor having a trench structure.

2. Description of the Related Art

There is a tendency that the chip size of a power supply IC represented by a voltage regulator and a voltage detector is reducing and output current of the voltage regulator is increasing. Among elements forming the power supply IC, a driver element for supplying current occupies a large part of the chip area, and thus, up to now, by adopting a MOS transistor having a trench structure, higher drive capability is sought through reduction in area and increase in effective channel width.

For example, Japanese Published Patent Applications 2003-101027 and H08-255901 present a conventional semiconductor device having a trench structure and a method of manufacturing the same.

A method of manufacturing a conventional vertical MOS transistor having a trench structure is described with reference to FIGS. 4A to 4H, which are schematic sectional views illustrating steps of the manufacturing method.

First, as illustrated in FIG. 4A, a first conductivity type well diffusion layer 23 (referred to as body) is formed in a region which includes a second conductivity type buried layer 22 and has a trench structure. A thermal oxide film 24 and a deposited oxide film 25 are stacked on the surface. A resist film 26 is used to pattern these oxide films to be used as a hard mask for trench etching. Then, as illustrated in FIG. 4B, after the resist film 26 is removed, etching is carried out using the hard mask formed by the stacked and patterned thermal oxide film 24 and deposited oxide film 25 to form a trench 27. Then, as illustrated in FIG. 4C, after the thermal oxide film 24 and the deposited oxide film 25 which are used as the hard mask are removed, a sacrificial oxide film 28 is formed by thermal oxidation for the purpose of improving the shape of the trench 27.

After that, as illustrated in FIG. 4D, the sacrificial oxide film 28 is removed, a gate insulating film 29 is formed by thermal oxidation, and further, a doped polycrystalline silicon film 30 doped with impurities is deposited. Then, as illustrated in FIG. 4E, by patterning using a resist film 32 and overetching the doped polycrystalline silicon film 30, a gate electrode 31 is obtained. Further, as illustrated in FIG. 4F, a resist film 33 is patterned and second conductivity type impurities are doped for the purpose of forming a source region, and then, as illustrated in FIG. 4G, a resist film 34 is newly patterned and first conductivity type impurities are doped for the purpose of forming a substrate potential region.

After that, as illustrated in FIG. 4H, a second conductivity type source heavily doped diffusion layer 35 and a first conductivity type substrate potential heavily doped diffusion layer 36 are formed by heat treatment. Then, after an interlayer insulating film 37 is deposited, a contact hole 38 for electrical connection of the gate electrode 31, the second conductivity type source heavily doped diffusion layer 35, and the first conductivity type substrate potential heavily doped diffusion layer 36 are formed. Then, plugs of tungsten or the like are embedded, and source substrate common potential wiring 40 and gate potential wiring 39 are formed.

In this way, an element structure of a vertical MOS transistor having a trench structure which vertically passes current and which includes the trench 27 formed in the first conductivity type well diffusion layer 23 is prepared.

However, in a vertical MOS transistor having a trench structure, when self-aligned silicidation is carried out for the purpose of reducing resistance of the contact for electrical connection of the gate electrode embedded in the trench, there is a problem that a silicide on the gate electrode embedded in the trench and a silicide on the substrate potential heavily doped diffusion layer and the source heavily doped diffusion layer adjacent to the trench are brought into electrical continuity. Accordingly, there is a problem that silicification on the gate electrode is difficult, and, when the width of the trench is reduced for the purpose of reducing the chip area, the resistance of the gate electrode increases.

SUMMARY OF THE INVENTION

In order to solve the above-mentioned problem, the present invention employs the following measures.

According to an exemplary embodiment of the present invention, a semiconductor device includes: a first conductivity type semiconductor substrate; a first conductivity type epitaxial growth layer provided on the first conductivity type semiconductor substrate with a second conductivity type buried layer sandwiched therebetween; a first conductivity type well diffusion layer formed in a part of the first conductivity type epitaxial growth layer on the second conductivity type buried layer; one of lattice-like trenches and stripe-like trenches which are formed so as to have a depth reaching the second conductivity type buried layer through the first conductivity type well diffusion layer and which are coupled to each other; a gate insulating film formed on a surface of the trench; a polycrystalline silicon film which fills the trench via the gate insulating film and which becomes a gate electrode protruding higher than a surface of the first conductivity type well diffusion layer; a side spacer formed on a side surface of the gate electrode; a second conductivity type source heavily doped diffusion layer and a first conductivity type substrate potential diffusion layer formed over island-like regions of the first conductivity type well diffusion layer so as to avoid the trenches; a silicide layer formed on the gate electrode; and a silicide layer formed on the second conductivity type source heavily doped diffusion layer and the first conductivity type substrate potential diffusion layer, in which the silicide layer formed on the gate electrode and the silicide layer formed on the second conductivity type source heavily doped diffusion layer and the first conductivity type substrate potential diffusion layer are separated from each other by the side spacer.

In the semiconductor device, the second conductivity type source heavily doped diffusion layer is formed on a dish-shaped bottom portion and surrounding swell region on the island-like region so as to avoid the trench.

According to another exemplary embodiment of the present invention, in a method of manufacturing the above-mentioned semiconductor device, a dish shape on an island-like region which is not a trench is formed by etching away a thick oxide film as a buried oxide film by shallow trench isolation (STI).

As described above, in the vertical MOS transistor having a trench structure, by forming and then removing the thick oxide film in the regions for electrical connection of the substrate potential heavily doped diffusion layer and the source heavily doped diffusion layer which are not the trenches, between the trenches at predetermined intervals, the regions which are high on the perimeter and low at the center are formed. By using the high region formed on the perimeter, the vertical MOS transistor having a trench structure which includes the side spacer is formed, and the silicide on the gate electrode embedded in the trench and the silicide on the substrate potential heavily doped diffusion layer and the source heavily doped diffusion layer can be separated from each other. By using this structure, a semiconductor device can be obtained which enables reduction in size of the trench to reduce the area and enables higher drive capability.

BRIEF DESCRIPTION OF THE DRAWINGS

In the accompanying drawings:

FIGS. 4A to 4H are schematic sectional views illustrating a method of manufacturing a conventional semiconductor device.

DETAILED DESCRIPTION OF THE PREFERRED EMBODIMENTS

Embodiments of the present invention are described below with reference to the attached drawings. FIGS. 1A to 1E and FIGS. 2A to 2E are schematic sectional views illustrating steps of a method of manufacturing a semiconductor device according to an embodiment of the present invention. These schematic sectional views are taken along lines corresponding to the line B-B of a plan view of FIG. 3A illustrating a semiconductor device according to an embodiment of the present invention.

Figure 1A:
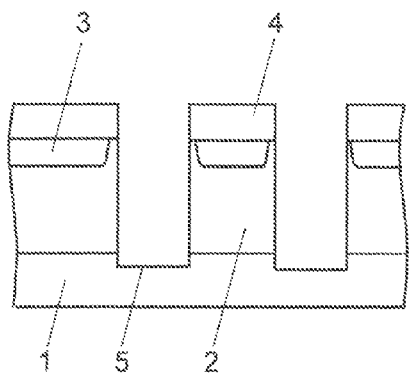
FIGS. 1A to 1E are schematic sectional views illustrating a method of manufacturing a semiconductor device according to an embodiment of the present invention.

As illustrated in FIG. 1A, a substrate is formed by growing a first conductivity type epitaxial growth layer to the thickness of several micrometers to several tens of micrometers on a first conductivity type semiconductor substrate which is a P-type semiconductor substrate doped with boron as impurities to have the resistivity of 20 Ωcm to 30 Ωcm. The epitaxial growth layer has a second conductivity type buried layer 1 in which N-type impurities such as arsenic, phosphorus, or antimony are diffused at a concentration of about $1 \times 10^{18}$ atoms/cm$^3$ to $1 \times 10^{18}$ atoms/cm$^3$.

Further, a first conductivity type well diffusion layer 2 which is also referred to as a body is formed in a region which becomes a region having a trench structure later by ion implantation at a dose of $1 \times 10^{12}$ atoms/cm$^2$ to $1 \times 10^{18}$ atoms/cm$^2$ using impurities such as boron or boron difluoride. For example, when the second conductivity type buried layer 1 is a P-type buried layer, impurities such as boron are doped with the above-mentioned concentration. The respective conductivity types of the first conductivity type semiconductor substrate, the second conductivity type buried layer 1, and the first conductivity type epitaxial growth layer are appropriately selected.

Still further, in a region which becomes a region having a trench structure later, a thick oxide film 3 which is a feature of the present invention is, for example, a buried oxide film represented by shallow trench isolation (STI) for separating elements. The thick oxide film has a thickness of, for example, several tens of nanometers and is provided on island-like regions of the first conductivity type well diffusion layer 2, which are not to be trenches. In this case, the thick oxide film 3 is thin on the perimeter of the island-like region, and is thick and has a predetermined thickness inside. The shape of the thick oxide film 3 is bowl-like or dish-like. Specifically, in the island-like region, there is a swell region in which the first conductivity type well diffusion layer 2 swells on the perimeter near the trenches, and a bottom portion is formed therein which is surrounded thereby. A hard mask 4 for trench etching is patterned and provided on the first conductivity type well diffusion layer 2 and on the thick oxide film 3. The hardmask 4 may be a thermal oxide film or a deposited oxide film having a single layer structure insofar as satisfactory resistance can be secured in trench etching later. Alternatively, the hard mask 4 may be a resist film or a nitride film.

Figure 3A:
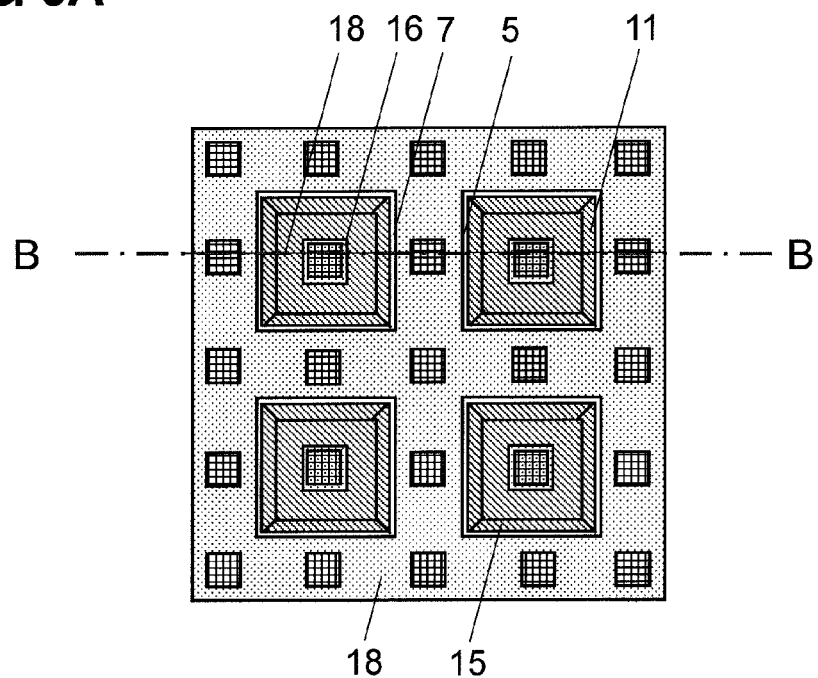
FIGS. 3A and 3B are schematic plan views illustrating semiconductor devices according to embodiments of the present invention.
Figure 3B:
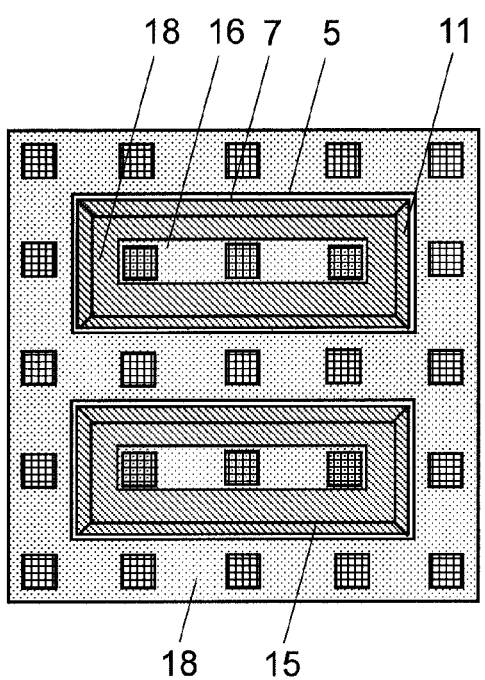
Figure 4A:
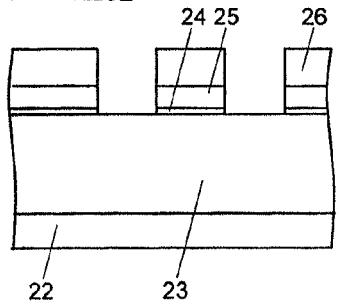
Figure 4B:
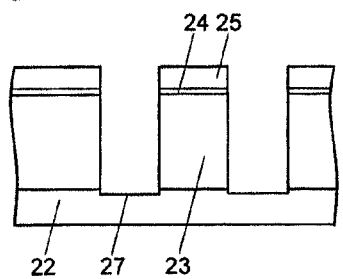
Figure 4C:
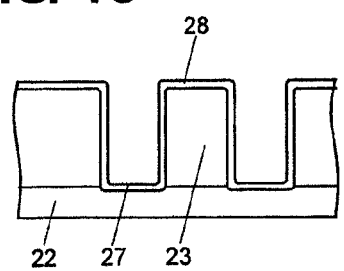
Figure 4D:
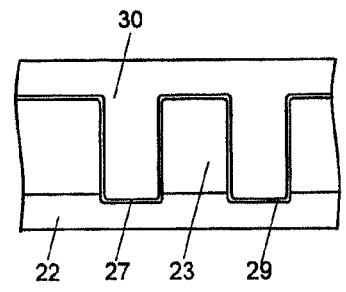
Figure 4E:
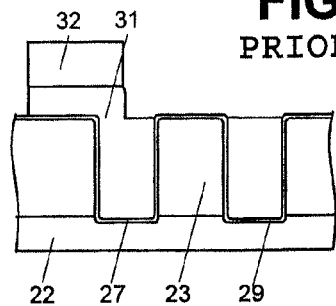
Figure 4E:
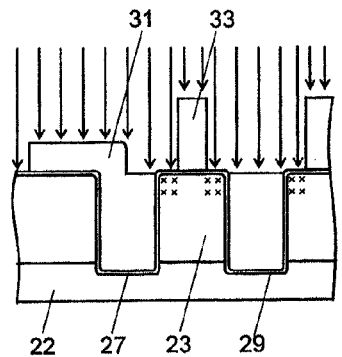
Figure 4E:
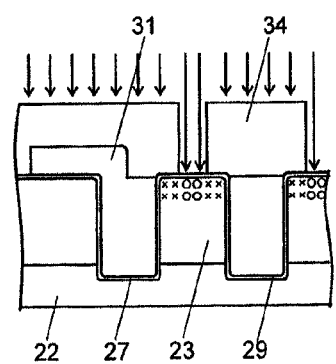
Figure 4E:
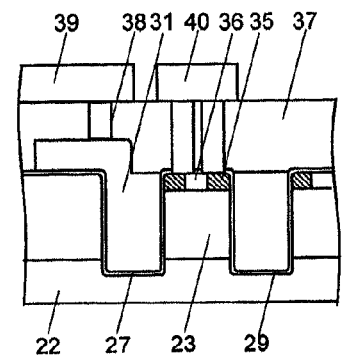

Then, etching using the hard mask 4 is carried out to form a trench 5. It is preferred that the formed trench 5 have a depth so that a bottom portion of the trench reaches the second conductivity type buried layer 1. FIG. 1A illustrates this state Further, as illustrated in FIG. 3A and FIG. 3B, the shape of the trenches 5 in plan view may be lattice-like or stripe-like. Both FIGS. 3A and 3B which are plan views of elements illustrate a basic cell of a vertical MOS transistor having a trench structure. In an actual semiconductor device, at least on the order of several hundreds to several thousands of such basic cells are integrated in a chip.

Figure 1D:
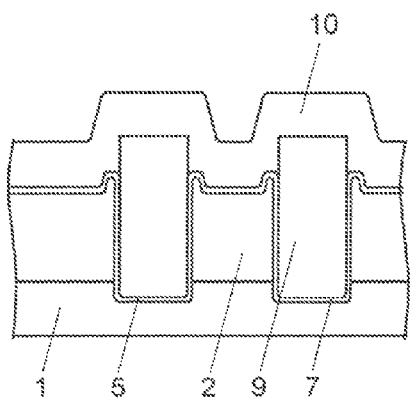
Figure 1B:
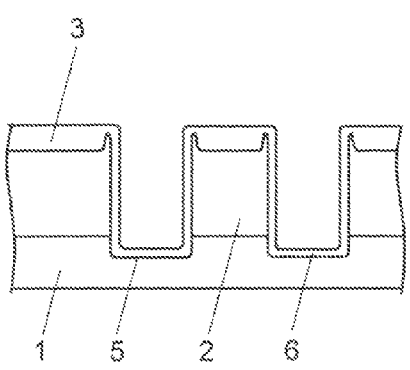

And, as illustrated in FIG. 1B, after the hardmask 4 is removed, for the purpose of improving the shape of the trench 5, a sacrificial oxide film 6 is formed by thermal oxidation at a thickness of, for example, several nanometers to several tens of nanometers.

Figure 1E:
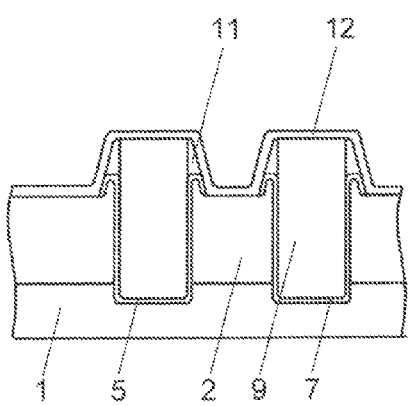
Figure 1C:
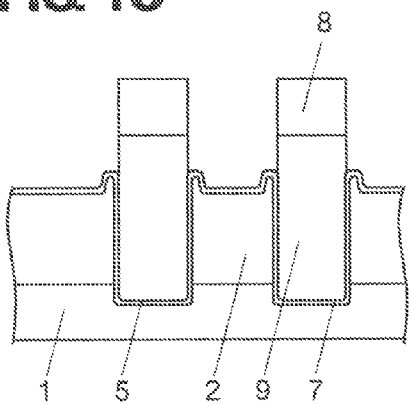

After that, as illustrated in FIG. 1C, removal of the sacrificial oxide film 6 and, at the same time, removal of the thick oxide film 3, leave the region from which the thick oxide film 3 has been removed lower than the surrounding plane, which is a feature of this embodiment. Specifically, the surface of the first conductivity type well diffusion layer 2, which is in the island-like region that is not a trench, is in the shape of a dish having a swelled perimeter and a lower plane inside. Then, a gate insulating film 7 is formed on the trench 5 and the first conductivity type well diffusion layer 2 with a thermal oxide film having a thickness of, for example, several hundreds of angstroms to several thousands of angstroms. Further, after deposition of a doped polycrystalline silicon film preferably at a thickness of 100 nm to 500 nm, the doped polycrystalline silicon film is patterned using a resist film 8 and over-etched to obtain a gate electrode 9 formed by filling the doped polycrystalline silicon film in the trench 5. The resist film 8 is patterned so as to cover a region over the trench 5, and thus, a surface of the gate electrode 9 protrudes from the surface of the first conductivity type well diffusion layer 2 and is higher than the surrounding swell region which is the highest in the dish-shaped portion.

After that, as illustrated in FIG. 1D, the resist film 8 is removed and a deposited oxide film 10 is stacked at a thickness of, for example, several hundreds of nanometers. Then, as illustrated in FIG. 1E, the deposited oxide film 10 is etched back to form a side spacer 11 on a side surface of the gate electrode 9. Then, a deposited oxide film 12 for ion implantation into a source heavily doped diffusion layer and a substrate potential heavily doped diffusion layer is deposited at a thickness of, for example, several tens of nanometers.

Figure 2A:
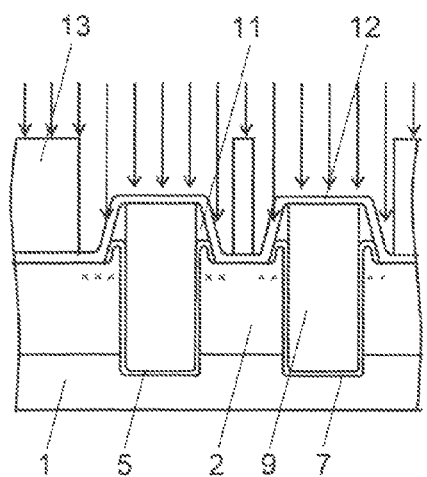
FIGS. 2A to 2E follow FIGS. 1A to 1E and are schematic sectional views illustrating the method of manufacturing a semiconductor device according to the embodiment of the present invention.

Further, as illustrated in FIG. 2A, patterning a resist film 13, and second conductivity type impurities are doped to form the source region by ion implantation. The region into which the impurities are implanted is in proximity to the surface of the first conductivity type well diffusion layer 2 on the side of the gate electrode 9.

Figure 2D:
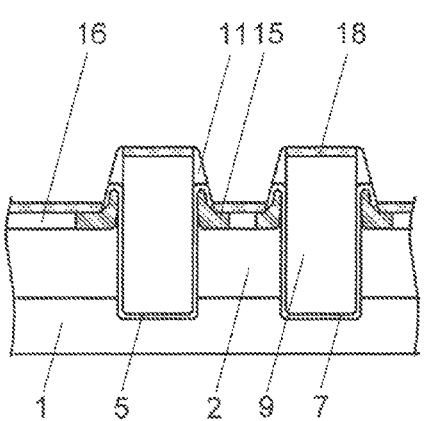
Figure 2B:
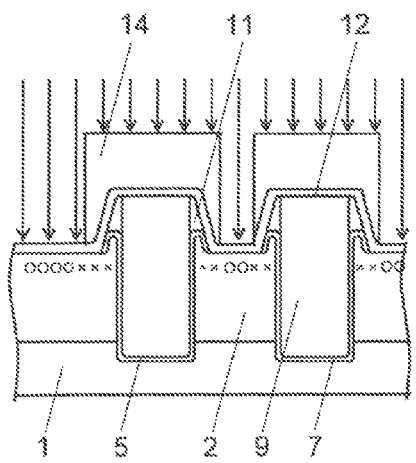

Further, as illustrated in FIG. 2B, after removal of the resist film 13, a new resist film 14 is patterned so as to cover the gate electrode 9 and the side spacer 11, and first conductivity type impurities are doped to form a substrate potential region by ion implantation. In relation to ion implantation illustrated in FIG. 2A and FIG. 2B, for example, arsenic or phosphorus ion is implanted for the N type conductivity preferably at a dose of $1 \times 10^{18}$ atoms/cm$^2$ to $1 \times 10^{16}$ atoms/cm$^2$. On the other hand, boron or boron difluoride ion is implanted for the P type conductivity preferably at a dose of $1 \times 10^{15}$ atoms/cm$^2$ to $1 \times 10^{16}$ atoms/cm$^2$. Further, impurity doping to the source region and the substrate potential region in these steps may be carried out simultaneously with impurity doping to a MOS transistor source region which does not include the trench 5 in the same chip.

Figure 2E:
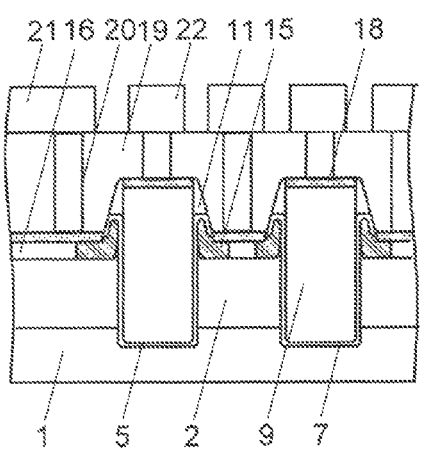
Figure 2C:
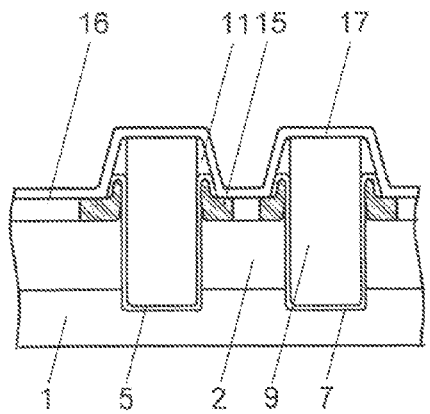

After that, as illustrated in FIG. 2C, heat treatment at 800° C. to 1,000° C. for several hours permits formation of a second conductivity type source heavily doped diffusion layer 15 on the first conductivity type well diffusion layer 2 on the side of the gate electrode 9, a first conductivity type substrate potential heavily doped diffusion layer 16 between a plurality of the second conductivity type source heavily doped diffusion layers 15, and the like. In this case, the surface of the first conductivity type well diffusion layer 2 is in the shape of a dish having a swelled perimeter, and thus, the second conductivity type source heavily doped diffusion layer 15 is formed not only in a bottom region of the dish but also in the surrounding swell region.

In this way, the elementary structure of the vertical MOS transistor having a trench structure, which includes the trench 5 formed in the first conductivity type well diffusion layer 2 and whose operation is vertical, is prepared. Then, after removal of the deposited oxide film 12 a metal film 17 for self-aligned silicidation, for example, cobalt or tungsten, is deposited at a thickness of several tens of nanometers.

Then, as illustrated in FIG. 2D, heat treatment at, for example, 800° C. to 1,000° C. for several tens of seconds to several minutes using RTA or the like leads to the formation of a silicide 18 on the gate electrode 9, the second conductivity type source heavily doped diffusion layer 15, and the first conductivity type substrate potential heavily doped diffusion layer 16. In this case, the silicide is not formed on the side spacer 11, and the silicide is formed in a self-aligning manner (salicide structure). Further, the silicide is formed in the bottom region of the dish on the second conductivity type source heavily doped diffusion layer 15, but the silicide is not formed on the surrounding swell region. This separates the silicide 18 on the gate electrode 9 and the silicide 18 on the second conductivity type source heavily doped diffusion layer 15 with a sufficient distance therebetween.

After that, as illustrated in FIG. 2E, after an interlayer insulating film 19 is stacked at a thickness of, for example, several hundreds of nanometers to 1 ?m, a contact hole 20 for electrical connection of the gate electrode 9, the second conductivity type source heavily doped diffusion layer 15, and the first conductivity type substrate potential heavily doped diffusion layer 16 are formed Then, plugs of tungsten or the like are embedded to form source substrate common potential wiring 21 and gate potential wiring 22.

In this way, the silicide on the gate electrode filling the trench, which is the feature of the present invention, can be formed to separate from and the silicide on the source heavily doped diffusion layer and on the substrate potential heavily doped diffusion layer in a self-aligning manner using the side spacer, and thus a sufficiently low contact resistance can be realized even under the reduction of the size of the gate electrode for reducing the area.

What is claimed is:
1. A semiconductor device, comprising:
a first conductivity type semiconductor substrate;
a first conductivity type epitaxial growth layer provided on the first conductivity type semiconductor substrate with a second conductivity type buried layer sandwiched therebetween;
a first conductivity type well diffusion layer formed in a part of the first conductivity type epitaxial growth layer on the second conductivity type buried layer;
one of lattice-like trenches and stripe-like trenches which are formed so as to have a depth reaching the second conductivity type buried layer from a surface of the first conductivity type well diffusion layer;
a gate insulating film formed on the trenches;
gate electrodes which fill respective ones of the trenches via the gate insulating film and which protrude higher than the surface of the first conductivity type well diffusion layer;
a side spacer formed on a side surface of the each gate electrode;
a second conductivity type source heavily doped diffusion layer and a first conductivity type substrate potential diffusion layer formed on island-like regions of the first conductivity type well diffusion layer but not on the trenches, wherein the island-like regions have a bottom portion and a surrounding swell region formed thereon, the side spaces are provided on the surrounding swell regions, and the second conductivity type source heavily doped diffusion layer is formed in the surrounding swell regions;
a first silicide layer formed on the gate electrodes; and
a second silicide layer formed on the second conductivity type source heavily doped diffusion layer and the first conductivity type substrate potential diffusion layer, wherein the first silicide layer and the second silicide layer are separated from each other by the side spacers.

* * * * *